United States Patent [19]

Williams

[11] 3,906,410

[45] Sept. 16, 1975

[54] SURFACE WAVE DEVICE AND METHOD OF MAKING

[75] Inventor: G. Norman Williams, Seneca Falls, N.Y.

[73] Assignee: GTE Sylvania Incorporated, Stamford, Conn.

[22] Filed: July 26, 1974

[21] Appl. No.: 492,193

[52] U.S. Cl............... 333/30 R; 29/25.35; 310/9.5; 333/72

[51] Int. Cl.²................. H03H 9/30; H01L 41/10; H01L 41/18

[58] Field of Search............ 333/30 R, 72; 29/25.35; 310/8, 8.1, 8.2, 9.5, 9.6, 9.7

[56] References Cited

UNITED STATES PATENTS 3,725,827 4/1973 Slobodnik, Jr.................. 310/9.5 X

*Primary Examiner*—James W. Lawrence
*Assistant Examiner*—Marvin Nussbaum
*Attorney, Agent, or Firm*—Norman J. O'Malley; Robert E. Walrath; Robert T. Orner

[57] ABSTRACT

A surface wave device with a lithium niobate substrate and a method of making such devices is disclosed. The lithium niobate substrate has a first pair of edges coincident with (0001) planes and a second pair of edges coincident with planes selected from one of the $[10\bar{1}\bar{2}]$, $[10\bar{1}2]$, and $[\bar{1}2\bar{1}0]$ families of planes.

8 Claims, 10 Drawing Figures

SURFACE WAVE DEVICE AND METHOD OF MAKING

BACKGROUND OF THE INVENTION

This invention relates to surface wave devices and more particularly to surface wave devices with at least one interdigital transducer disposed on a substrate of lithium niobate.

Surface wave devices are frequency responsive or selective devices which can be used in a variety of applications such as intermediate frequency filters, frequency discriminators, and the like. Surface wave devices delay signals applied thereto and accordingly are also used as delay lines. A typical surface wave filter or frequency discriminator includes an input transducer comprised of a pair of comb like electrodes with interleaved fingers to form an interdigital transducer disposed on a piezoelectric substrate and at least one output interdigital transducer disposed on the substrate. The input transducer launches a surface wave along the surface of the substrate which is intercepted by the output transducer. The number of fingers, width of the fingers, and spacing between fingers as well as other physical characteristics of the transducers and substrate determine the frequency response, that is, center frequency and pass band, of the surface wave device. Since the input transducer launches surface waves in both directions therefrom, it is a common practice to place output transducers on both sides of the input transducer to thereby increase the efficiency of the device.

A persistent problem with surface wave devices involves reflected waves and particularly waves reflected from the ends of the substrate. When the output transducers intercept the surface wave launched by the input transducer, some of the energy passes beyond the output transducer to the end of the substrate. The reflected wave again strikes the output transducer causing a slightly delayed representation of the signal to be provided by the output transducer. For example, if a surface wave device is used as an intermediate frequency filter in a television receiver, the reflected wave results in ghosts in the displayed image.

The prior art discloses two general approaches to alleviating the problem of reflected waves. First, the substrate can be made sufficiently long so that the wave reflected from the end of the substrate is attenuated to an insignificant level. This approach is impractical because of the large substrate size that results and the attendant expense and manufacturing difficulties. Second, the substrate can be shaped such that reflected waves are diverted at some angle away from the transducers. This approach has found acceptance in the art leading to the practice of cutting the ends of the substrate at some angle other than 90° with respect to the sides. In addition, a damping material such as wax can be placed along the edges of the substrate to further attenuate reflected waves.

While a number of piezoelectric materials can be used as substrates in surface wave devices, lithium niobate has numerous desirable characteristics which make it a preferred substrate material. It has also been found that orienting the input and output transducers on the substrate such that the surface waves travel along the Z-axis of the substrate produces advantageous operation.

Due to the above consideration as well as numerous other considerations, the typical prior art practice in manufacturing surface wave devices is to deposit an array of interdigital transducers in rows and columns on a wafer of lithium niobate. The individual devices are then separated by mechanically sawing through the substrate so that the devices can be individually packaged. This technique of separating the individual devices is very unreliable and cumbersome resulting in lowered yields and deleterious performance.

It is known that single crystal materials possess cleavage planes which are the preferred directions for ease of breaking the crystal. Lithium niobate has a complex rhombohedral structure and possesses cleavage planes in several orientations cited previously. Utilizing the cleavage planes in lithium niobate to break the wafer has heretofore been unknown with respect to the manufacture of surface wave devices.

OBJECTS AND SUMMARY OF THE INVENTION

Accordingly, it is the primary object of this invention to obviate the above noted disadvantages of the prior art.

It is a further object of this invention to provide a new and novel surface wave device having a substrate of lithium niobate.

It is a further object of this invention to provide a novel method to easily and reliably manufacture surface wave devices having lithium niobate substrates.

In one aspect of this invention the above-noted and other objects and advantages of this invention are achieved in a surface wave device having at least one interdigital transducer disposed in a substrate of lithium niobate. The lithium niobate substrate has a first pair of edges coincident with (0001) planes and a second pair of edges coincident with planes selected from one of the $[10\bar{1}\bar{2}]$, $[10\bar{1}2]$, and $[\bar{1}2\bar{1}0]$ families of planes.

In another aspect of this invention the above-noted and other objects and advantages of this invention are achieved by a method of making surface wave devices each having at least one interdigital transducer disposed on a substrate of lithium niobate. The method includes the steps of depositing an array of rows and columns of interdigital transducers on a surface of a substrate of lithium niobate coincident with an X-Z plane, scribing the substrate between each of the columns of the interdigital transducers along (0001) planes and between each of the rows of interdigital transducers along planes selected from one of the $[10\bar{1}\bar{2}]$, $[10\bar{1}2]$, and $[\bar{1}2\bar{1}0]$ families of planes, and breaking the substrate along the scribe lines coincident with the planes.

DETAILED DESCRIPTION OF THE PREFERRED EMBODIMENTS

For a better understanding of the present invention, together with other and further objects, advantages and capabilities thereof, reference is made to the following disclosure and appended claims in conjunction with the accompanying drawings.

Figure 1:
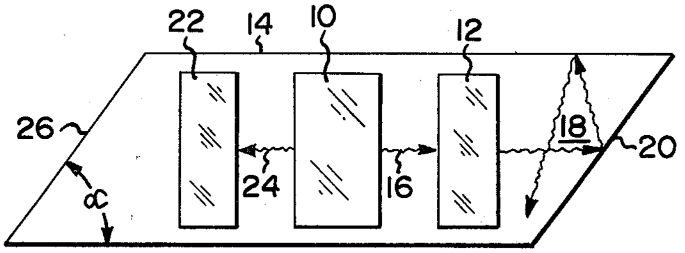
FIG. 1 is a schematic illustration of a surface wave device in accordance with one embodiment of the invention.

FIG. 1 is a schematic illustration of a surface wave device having an input transducer 10 and an output transducer 12 both preferably of the interdigital type described above. Transducers 10 and 12 are disposed on a substrate of lithium niobate 14 such that surface waves launched by input transducer 10, represented by arrow 16, travel along the Z-axis of substrate 14. Surface waves 16 are intercepted by output transducer 12, however, a portion of the energy therein travels beyond output transducer 12 to the end of substrate 14. As was described above, if the end substrate 14 is cut at a proper angle, the reflected waves, represented by arrows 18, are either attenuated by the material between output transducer 12 and end 20 of substrate 14, including any damping material on end 20, or strike output transducer 12 at an angle such that the piezoelectric coupling coefficient is very low so that interference due to reflected surface waves 18 is alleviated or minimized.

As was noted above, the surface wave device of FIG. 1 may include a second output transducer 22 disposed on substrate 14 on the opposite sides of input transducer 10. Output transducers 12 and 22 can be connected in parallel electrically by external connections or used to provide a differential output signal to increase the efficiency of the surface wave device. In the case of FM discriminators, output transducers 12 and 22 can be "tuned" to slightly different center frequencies to provide a typical S-shaped FM discriminator curve. Input transducer 10 launches a surface wave, represented by arrow 24, in the direction of output transducer 22. A portion of the energy in surface wave 24 passes output transducer 22 and strikes end 26 of substrate 14 where it is reflected in a manner similar to the wave reflected from end 20. Ends 20 and 26 are at an angle $\alpha$ with respect to the sides of substrate 14 which is advantageously selected so that the above-described interference minimization is obtained.

Figure 2:
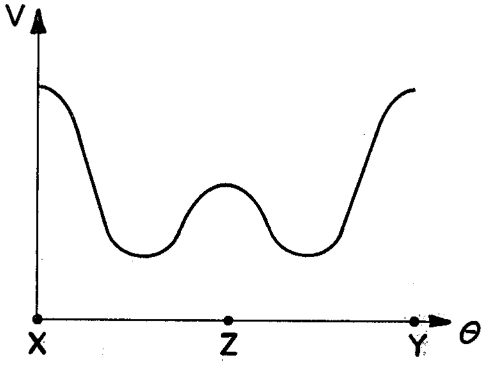
FIG. 2 is a plot of velocity of surface waves versus the angle or direction of propagation on a lithium niobate substrate.

As was noted above, input transducer 10 and output transducers 12 and 22 are oriented or disposed on substrate 14 such that surface waves 16 and 24 propagate along the Z-axis of substrate 14. FIG. 2 is a plot of the velocity versus propagation angle $\theta$ for a lithium niobate substrate. It should be noted that the plot has a peak corresponding to the Z-axis. Due to the "troughs" on both sides of the Z-axis, the surface waves are "steered" along the Z-axis. This "steering" of the surface waves tends to prevent dispersal of the surface waves as they travel along substrate 14.

Figures 3, 3A, 3B, 3C, 3D:
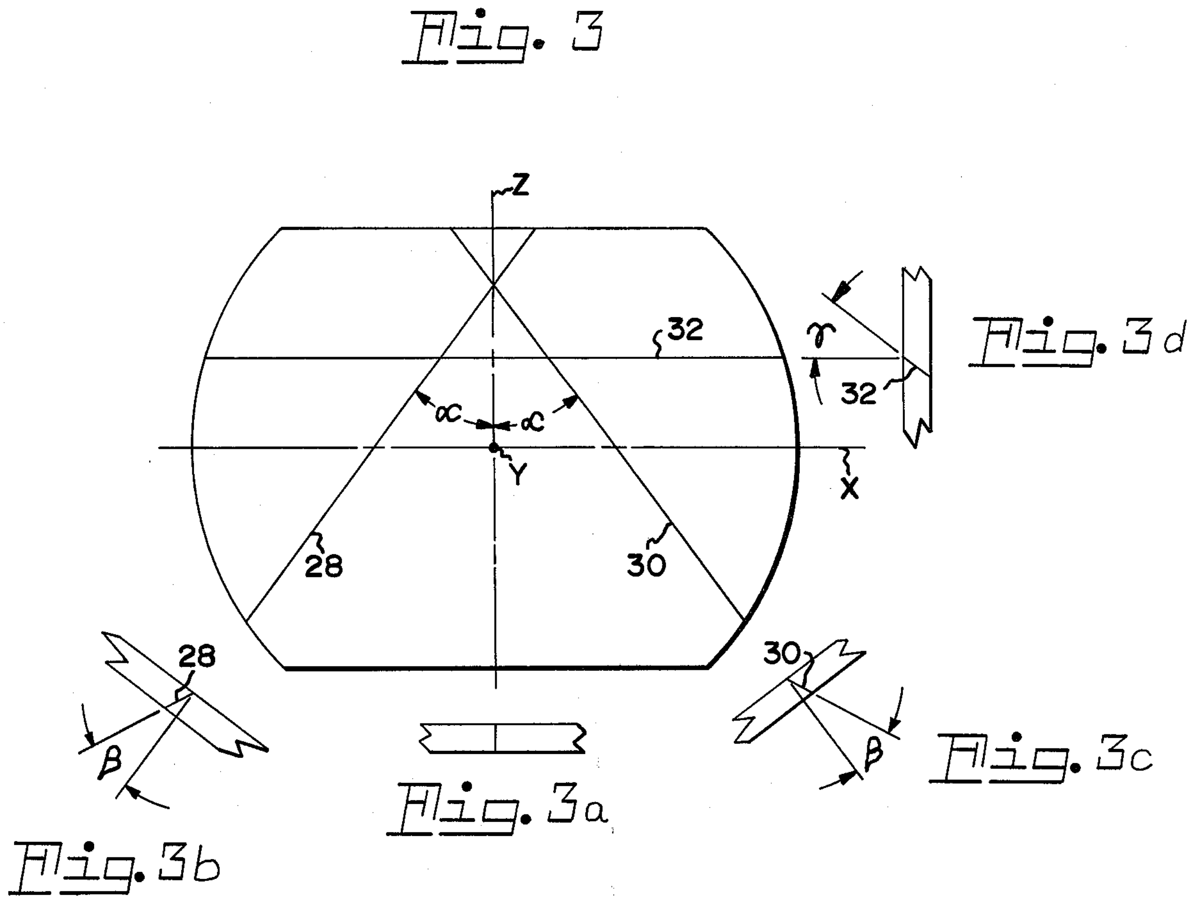
FIG. 3 is a plan view of a wafer of lithium niobate illustrating cleavage planes therein.
FIGS. 3*a*, 3*b*, 3*c*, and 3*d* are edge views of the wafer of FIG. 3 further illustrating the cleavage planes therein.

FIG. 3 is a plan view of a lithium niobate die or wafer which together with the edge views in FIGS. 3*a*, 3*b*, 3*c* and 3*d* illustrate various cleavage planes therein. The surface of the wafer coincides with an X-Z plane with the Y-axis of the crystal normal to the surface of the wafer.

The Miller indices (*hkl*) used to describe cleavage planes in some classes of crystalline substances are inadequate to completely describe cleavage planes in lithium niobate since it has a rhombohedral structure. A set of four indices (*hkil*) called the Bravais-Miller indices which are used in the hexagonal crystal system can also be used to identify cleavage planes in lithium niobate. Accordingly, Bravais-Miller indices are used in this application. It is noted that sometimes (*i*) is replaced by a dot because of the constraint that the first three indices must add to zero so that specification of the first two indices also specifies the third.

It has been discovered that four cleavage planes are of particular interest and can be advantageously used in manufacturing surface wave devices with lithium niobate substrates. These cleavage planes are illustrated in FIG. 3 and are included in the [0001], [1012], [1012], and [1210] families of planes. Cleavage planes in the [0001] family coincide with or are parallel to the Z-axis and normal to the X-Z plane as is illustrated in the edge view of FIG. 3*a*. Cleavage planes in the [$10\bar{1}\bar{2}$] family are at an angle $\alpha$ of about 37° with respect to the Z-axis and at an angle $\beta$ of about 25° with respect to the Y-axis. In FIG. 3 one plane in the [$10\bar{1}\bar{2}$] family is represented by line 28. Similarily, cleavage planes in the [$10\bar{1}\bar{2}$] family lie at an angle $\alpha$ on the opposite side of the Z-axis and at an angle $\beta$ with respect to the Y-axis. One plane in the [$10\bar{1}2$] family is represented by line 30. The fourth family of cleavage planes of interest is the [1210] family which lie parallel to the X-axis and at an angle $\gamma$ of about 57° to the Y-axis. One plane in this family is represented by line 32.

Figure 4A:
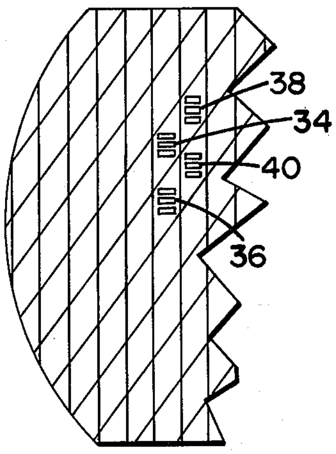
FIGS. 4*a* and 4*b* are illustrations of alternate embodiments of the method of making surface wave devices in accordance with the invention.
Figure 4B:
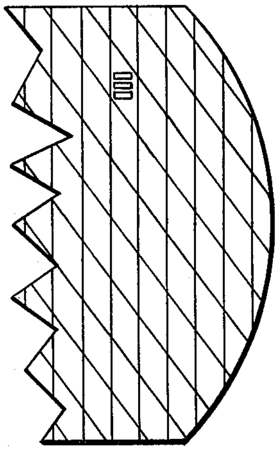

The method of manufacturing a surface wave device in accordance with the invention is more fully illustrated in FIGS. 4*a* and 4*b*. A wafer of lithium niobate which can be on the order of 20 mils thickness and of suitable surface area and dimensions is prepared by polishing and shaping the wafer using known techniques. Next, an array of rows and columns of interdigital transducers is deposited on a surface of the substrate. The array is deposited such that each column of devices can be separated from the adjacent columns by breaking along (0001) planes as is illustrated in FIGS. 4a and 4b. For example, in FIG. 4a devices 34 and 36 are deposited in a first column while devices 38 and 40 are deposited in an adjacent column. Devices 34 and 38 are similarly in a first row while devices 36 and 40 are in a second row such that the rows of devices can be separated by separating the wafer along ($10\bar{1}\bar{2}$) planes represented by line 28 of FIG. 3. If it is desired to use ($10\bar{1}2$) planes represented by line 30 of FIG. 3, the rows are arranged as is illustrated in FIG. 4*b*. After the surface wave devices have been deposited in the array of either FIGS. 4*a* or 4*b*, the wafer or substrate is scribed between each of the columns along (0001) planes and between each of the rows along planes selected from one of the [$10\bar{1}\bar{2}$] or [$10\bar{1}2$] families of planes depending upon whether the arrangement of FIG. 4*a* or FIG. 4*b* is used.

The scribing step can be performed with commercially available diamond scribers or saw scribers using known techniques. For example, when a diamond scriber is used, a conical diamond scribe is preferred. It has been found that when the scribe is held at an angle of 20° to the substrate and a pressure of 200 grams is applied, a suitable kerfdepth is obtained. When a saw scriber is used, the downward pressure is preferably adjusted to obtain a kerfdepth from about 4 to about 6 mils. It has been found that these kerfdepths are sufficient to provide satisfactory breaks along the desired plane when the substrate is 20 mils thick. A 20 mil thickness, however, is used primarily to provide sufficient substrate thickness to attenuate bulk (shear) waves which would otherwise cause interference. When different substrate thicknesses are used, it may be desirable to vary the scribing operation to obtain different kerfdepths.

After the wafer is scribed, the substrate is broken along the scribe lines. Since each of the scribe lines coincides with a cleavage plane, the substrate will tend to break along the cleavage planes. Any one of a variety of commercially available breaking tools can be used in the breaking step.

Figure 5:
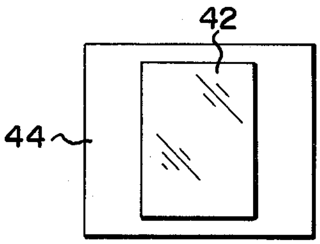
FIG. 5 is a schematic illustration of another embodiment of the invention.

In some cases a rectangular substrate is desired for a surface wave device. FIG. 5 schematically illustrates a single interdigital transducer 42 disposed on a substrate 44 of lithium niobate. A rectangular substrate 44 can be used in certain applications such as where the surface wave device is used as an impedance. Where a rectangular substrate is desired, it has been found that the rows can be separated by scribing and breaking along planes in the $[\bar{1}2\bar{1}0]$ family of planes represented by line 32 of FIG. 3. Except for the direction of the rows the above-described method can also be satisfactorily employed to obtain surface wave devices with rectangular substrates.

Accordingly, a method for easily and reliably separating surface wave devices deposited in an array on a wafer of lithium niobate has been disclosed. Utilization of the method results in surface wave devices with desired end cuts so that surface waves which reach the ends of the substrate are reflected at angles which advantageously does not cause a deleterious affect on the operation of the surface wave device.

While there has been shown and described what is at present considered the preferred embodiments of the invention, it will be obvious to those skilled in the art that various changes and modifications may be made therein without departing from the invention as defined by the appended claims.

I claim as my invention:

1. A surface wave device having at least one interdigital transducer disposed on a substrate of lithium niobate having a first pair of edges coincident with (0001) planes and a second pair of edges coincident with planes selected from one of the $[10\bar{1}\bar{2}]$, $[10\bar{1}2]$, and $[\bar{1}2\bar{1}0]$ families of planes.

2. A surface wave device as defined in claim 1 wherein said second pair of edges coincide with $(\bar{1}2\bar{1}0)$ planes.

3. A surface wave device as defined in claim 1 wherein said second pair of edges coincide with planes selected from one of the $[10\bar{1}\bar{2}]$ and $[10\bar{1}2]$ families of planes.

4. A surface wave device as defined in claim 3 wherein an input transducer and at least one output transducer are disposed on said substrate and oriented for surface wave propagation along the Z-axis of said substrate.

5. A method of making surface wave devices each having at least one interdigital transducer disposed on a substrate of lithium niobate comprising the steps of:

depositing an array of rows and columns of interdigital transducers on a surface of a substrate of lithium niobate coincident with an X-Z plane;

scribing said substrate between each of said columns of interdigital transducers along (0001) planes and between each of said rows of interdigital transducers along planes selected from one of the $[10\bar{1}\bar{2}]$, $[10\bar{1}2]$, and $[\bar{1}2\bar{1}0]$ families of planes; and breaking said substrate along the scribe lines coincident with said planes.

6. A method as defined in claim 5 wherein said substrate is scribed along planes between each of said rows selected from the $[\bar{1}2\bar{1}0]$ family of planes.

7. A method as defined in claim 5 wherein each of said surface wave devices includes an input transducer and at least one output transducer oriented for surface wave propagation along the Z-axis of said substrate.

8. A method as defined in claim 7 wherein said substrate is scribed along planes between each of said rows selected from one of the $[10\bar{1}\bar{2}]$ and $[10\bar{1}2]$ families of planes.

* * * * *

UNITED STATES PATENT OFFICE

CERTIFICATE OF CORRECTION

PATENT NO. : 3,906,410

DATED : September 16, 1975

INVENTOR(S) : G. Norman Williams

It is certified that error appears in the above-identified patent and that said Letters Patent are hereby corrected as shown below:

Column 4, line 19 - Please delete "[1012]" and insert $[10\bar{1}\bar{2}]$

Column 4, line 20 - Please delete "[1012]" and "[1210]" and insert $[10\bar{1}2]$ and $[\bar{1}2\bar{1}0]$ Column 4, line 28 - Please delete "$[10\bar{1}\bar{2}]$ and insert $[10\bar{1}2]$ Column 4, line 32 - Please delete "[1210]" and insert $[\bar{1}2\bar{1}0]$

Signed and Sealed this

*ninth* Day of *December 1975*

[SEAL]

*Attest:*

RUTH C. MASON
*Attesting Officer*

C. MARSHALL DANN
*Commissioner of Patents and Trademarks*